United States Patent
Komatsubara et al.

(10) Patent No.: US 7,007,379 B2
(45) Date of Patent: Mar. 7, 2006

(54) PRODUCTION METHOD OF PRINTED CIRCUIT BOARD

(75) Inventors: Makoto Komatsubara, Ibaraki (JP); Yasuhito Ohwaki, Ibaraki (JP); Takeshi Yoshimi, Ibaraki (JP); Shigenori Morita, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 297 days.

(21) Appl. No.: 10/385,172

(22) Filed: Mar. 10, 2003

(65) Prior Publication Data

US 2003/0172526 A1   Sep. 18, 2003

(30) Foreign Application Priority Data

Mar. 12, 2002   (JP)   ............................. 2002-067245

(51) Int. Cl.
*H05K 3/10*   (2006.01)

(52) U.S. Cl. ............................. 29/846; 29/825; 29/830
(58) Field of Classification Search .................. 427/97, 427/99; 29/825, 846, 852, 830, 831
See application file for complete search history.

(56) References Cited

U.S. PATENT DOCUMENTS

| | | | | |
|---|---|---|---|---|
| 3,932,932 A | * | 1/1976 | Goodman | 29/852 |
| 5,120,384 A | * | 6/1992 | Yoshimitsu et al. | 156/242 |
| 5,633,532 A | * | 5/1997 | Sohara et al. | 257/700 |
| 6,317,948 B1 | * | 11/2001 | Kola et al. | 29/25.42 |
| 6,571,467 B1 | * | 6/2003 | Haze et al. | 29/852 |

FOREIGN PATENT DOCUMENTS

| | | |
|---|---|---|
| JP | 09-260844 A | 10/1997 |
| JP | 2001-101637 | 4/2001 |
| JP | 2001-185849 A | 7/2001 |

* cited by examiner

*Primary Examiner*—Rick Kiltae Chang
(74) *Attorney, Agent, or Firm*—Leydig, Voit & Mayer, Ltd.

(57) ABSTRACT

The present invention provides a production method of a printed circuit board having a circuit pattern with a little variation in the thickness at a low cost without a special step for removal of a dummy pattern. The present invention is characterized in that an insulating layer 2 is formed in a given pattern on one surface of a supporting substrate 1, a circuit pattern 6 is formed on the insulating layer 2 while forming a dummy pattern 7 in an area free of the insulating layer 2 on the one surface of the supporting substrate 1, and an unnecessary part of the supporting substrate 1, which is free of the insulating layer 2 and the circuit pattern 6, is removed by dissolution together with the dummy pattern 7.

4 Claims, 8 Drawing Sheets

PRODUCTION METHOD OF PRINTED CIRCUIT BOARD

FIELD OF THE INVENTION

The present invention relates to a production method of a printed circuit board. More particularly, this invention relates to a production method of a printed circuit board, which can reduce variation in the thickness of a circuit pattern.

BACKGROUND OF THE INVENTION

To meet the request for miniaturization and high integration of electric devices and electronic devices in recent years, the pitch of circuit patterns on a printed circuit board has been made smaller. A circuit pattern having a fine pitch (distance between neighboring patterns) of not more than about 75 $\mu$m is formed by an additive method, a semi-additive method and the like.

According to the additive method, for example, a resist pattern is formed on an insulating substrate, a conductive layer made of copper is formed in an area other than the resist pattern by plating, and the resist pattern is removed. In this way, a circuit pattern is formed in an area other than the resist pattern.

According to the semi-additive method, a metal backing layer of Cr and the like is first formed on an insulating substrate by plating, vapor-deposition and the like, and a resist pattern is formed on the metal backing layer. Subsequently, Cu layer is formed on the metal backing layer in the area other than the resist pattern by plating, and the resist pattern is removed to form a circuit pattern. Then, using the circuit pattern as a mask, the metal backing layer is etched. In this way, a circuit pattern is formed in the area other than the resist pattern. In the printed circuit board produced by the semi-additive method, elution of a metal ion constituting the circuit pattern into the insulating substrate, which is what is called ion migration, can be prevented, because the circuit pattern is formed on the insulating substrate via the metal backing layer of Cr layer and the like.

In the production of a printed circuit board according to the additive method or the semi-additive method, variation in the thickness of circuit pattern has become a problem. That is, a pattern present in the central area of a printed circuit board where a number of circuit patterns are disposed, and a pattern present in the outer peripheral area of the printed circuit board surrounded by an area free of a circuit pattern show different current densities during plating. As a result, despite the fact that they have been formed by the same process, the pattern present in the central area and that present in the outer peripheral area have different thicknesses. To solve this problem, a dummy pattern has been conventionally formed on the outside of the circuit pattern (JP-A-2001-101637).

FIG. 9(a)–FIG. 9(c) show concrete example of such dummy pattern.

FIG. 9(a) shows an embodiment wherein a solid dummy pattern is disposed near a circuit pattern, FIG. 9(b) shows an embodiment wherein a circuit pattern is surrounded by a solid dummy pattern, and FIG. 9(c) shows an embodiment wherein a dummy pattern having the same shape as a circuit pattern is arranged near the circuit pattern.

However, the dummy pattern is inherently unnecessary for the printed circuit board and needs to be removed ultimately. When a dummy pattern is simultaneously removed (dissolved) along with an insulating substrate in an etching step for the insulating substrate, without particularly applying a step for exclusively removing the dummy pattern, the dummy pattern is not completely dissolved and remains as a residue. In the above-mentioned case, therefore, after forming a circuit pattern (dummy pattern), the dummy pattern is removed by etching and the like. In other words, forming a dummy pattern necessitates a removal step of the dummy pattern, which in turn makes the production cost of a printed circuit board expensive.

SUMMARY OF THE INVENTION

In view of the above-mentioned situation, it is an object of the present invention to provide a production method capable of removing a dummy pattern without a special dummy pattern removal step and affording a printed circuit board having a circuit pattern with a little variation in the thickness.

The present invention is characterized by the following to achieve the above-mentioned object.

(1) A production method of a printed circuit board, which comprises the steps of
  forming an insulating layer in a given pattern on one surface of a supporting substrate,
  forming a circuit pattern on the insulating layer while forming a dummy pattern in an area free of the insulating layer on said surface of the supporting substrate, and removing by dissolving an unnecessary part of the supporting substrate, which is free of the insulating layer and the circuit pattern, together with the dummy pattern.

(2) The production method of the printed circuit board of the above-mentioned (1), wherein the dummy pattern has a width of the pattern of not more than 200 $\mu$m.

(3) The production method of the printed circuit board of the above-mentioned (1), wherein the above-mentioned supporting substrate is made of stainless steel, Ni—Fe alloy, copper, aluminum, copper-beryllium or phosphor bronze.

(4) The production method of the printed circuit board of the above-mentioned (1), wherein the above-mentioned insulating layer is made from a polyimide resin containing a photosensitive material.

In the present invention, a circuit pattern and a dummy pattern are not formed on the same plane, unlike the conventional manner. In the present invention, a supporting substrate (metal foil, metal thin plate etc.) planned to be partly removed by dissolving (wet etching) is used, an insulating layer is formed in a given area on one surface of the supporting substrate, and a circuit pattern is formed on the insulating layer while forming a dummy pattern in an area free of the insulating layer on said surface of the supporting substrate. Thereafter, an unnecessary part of the supporting substrate, which is free of the insulating layer and the circuit pattern, is removed by wet etching together with the dummy pattern, whereby the conventional step for removing the dummy pattern becomes unnecessary.

In the Figures, 1 shows a supporting substrate, 2 shows an insulating layer, 3 shows a conductive layer, 4 shows a resist pattern, 6 shows a circuit pattern, 7 shows a dummy pattern, and 100 shows a printed circuit board.

DETAILED DESCRIPTION OF THE INVENTION

The present invention is explained in detail in the following.

The production method of the printed circuit board of the present invention characteristically comprises the following Step 1 to Step 3.

Step 1: formation of an insulating layer in a given pattern on one surface of a supporting substrate.

Step 2: formation of a circuit pattern on the above-mentioned insulating layer while forming a dummy pattern in an area free of the insulating layer on said surface of the supporting substrate.

Step 3: removal by dissolution of an unnecessary part (including the dummy pattern) of the supporting substrate, which is free of the insulating layer and the circuit pattern.

The production method of the printed circuit board of the present invention encompasses both the "additive method" and the "semi-additive method". The present invention is explained in more detail in the following by one example of the production step of a printed circuit board by the semi-additive method.

FIGS. 1–6 are sectional views schematically showing production of a printed circuit board according to the method of the present invention.

[Step 1]

Figure 1:
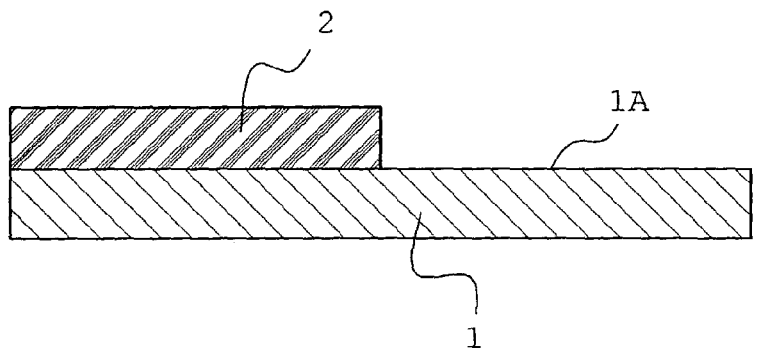
FIG. 1 shows a schematic sectional view of one embodiment of the printed circuit board produced by the production method of the present invention, where an insulating layer having a given pattern is formed on a supporting substrate.

As shown in FIG. 1, an insulating layer 2 having a given pattern is formed on one surface (top surface) 1A of a supporting substrate 1.

As the supporting substrate 1, a metal foil and a metal thin plate made of various metals can be used. Of these, a metal foil and a metal thin plate made of stainless steel, Ni—Fe alloys such as 42 alloy (42% Ni—Fe alloy), copper, aluminum, copper-beryllium, phosphor bronze and the like are preferable from the aspects of anti-corrosion, elasticity and the like. Particularly, stainless steel and 42 alloy are preferable. The supporting substrate 1 preferably has a thickness of about 10–60 $\mu$m, more preferably 15–30 $\mu$m, for achieving efficient removal by dissolution (wet etching) of the supporting substrate to be mentioned later, and vibration characteristic of a printed circuit board. The supporting substrate 1 has a width of generally about 50–500 mm, preferably about 125–300 mm. As used herein, the "width of the supporting substrate" means the length of each of the orthogonal two sides when the outer shape of the supporting substrate 1 is tetragon (square, rectangle), and the length of diameter, major axis or minor axis when the outer shape of the supporting substrate 1 is a circle, an ellipse or a shape similar thereto.

While the material (insulator) of the insulating layer 2 is not particularly limited, it is preferably a synthetic resin such as polyimide resin, acrylic resin, polyether nitrile resin, polyether sulfone resin, polyethylene terephthalate resin, polyethylene naphthalate resin, polyvinyl chloride resin and the like. Of these, polyimide resin is preferable, and polyimide resin, to which a photosensitive material such as dihydropyridine derivative and the like has been added to impart photosensitivity (affording patterning by exposure and development), is particularly preferable, because heat resistance, mechanical strength and dimensional stability become superior. When a resin without photosensitivity is used, an insulating layer 2 having a given pattern is formed on one surface of a supporting substrate 1A by adhering a film formed into a given shape by a suitable method to one surface 1A of the supporting substrate 1 with an adhesive (thermosetting adhesive, thermoplastic adhesive etc.).

The thickness of the insulating layer 2 is preferably 2–20 $\mu$m, more preferably 5–15 $\mu$m, from the aspect of insulating property.

A method for forming an insulating layer 2 having a given pattern, using a polyimide resin having photosensitivity is explained in the following. First, a polyimide precursor solution is applied onto the entirety of one surface of a supporting substrate, and dried at, for example, 60–150° C., preferably 80–120° C., to form a coating of a polyimide precursor. Then, the coating is exposed to light via a photomask and the exposed part is heated and developed for given patterning of the coating.

The light to be irradiated for the above-mentioned exposure preferably has an exposure wavelength of 300–450 nm, more preferably 350–420 nm. The exposure accumulated energy is preferably 100–1000 mJ/cm$^2$, more preferably 200–700 mJ/cm$^2$.

Of the coating, the part exposed to light and heated at a temperature of not less than 130° C. and less than 150° C. is dissolved during development (the part not exposed to light is insolubilized, positive-type) and the part exposed to light and heated at a temperature of not less than 150° C. and less than 180° C. does not dissolve during development (the part not exposed to light is solubilized, negative-type). The development is conducted using a known developing solution such as an alkaline developing solution and the like, according to a known method such as immersion method, spray method and the like.

The coating after patterning in the above-mentioned manner is heated to 250° C. or higher (preferably 250–400° C.) for setting (imidization), whereby an insulating layer 2 made of a polyimide resin and having a given pattern is obtained. When an insulating layer 2 having a given pattern is formed from a polyimide resin in this way, the thickness thereof is preferably 2–20 $\mu$m, more preferably 5–15 $\mu$m. The foregoing is Step 1.

[Step 2]

After forming an insulating layer 2 having a given pattern, a circuit pattern is formed by the following steps.

Figure 2:
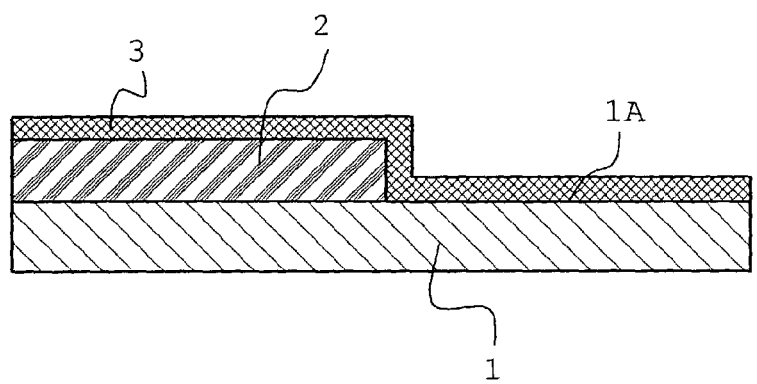
FIG. 2 shows a schematic sectional view of the state where a conductive layer is formed on the entirety of one surface of a supporting substrate to cover the insulating layer after the state shown in FIG. 1.

As shown in FIG. 2, a conductive layer 3 is formed on the entirety of one surface 1A of the supporting substrate 1, thereby to cover, the insulating layer 2. The material (conductor) for forming a conductive layer 3 is not particularly limited and Cr, Cu, Ni, Ti, Ni—Cr alloy and the like are exemplified. Of these, Cr and Cu are preferable from the aspect of adhesion to insulating layer 2. Such conductive layer 3 may consist of a single layer or a laminate of two or more layers (films) made of different metals. In the case of constitution of a laminate of two or more layers (films), a Cr layer (film), then a Cu layer (film) are preferably laminated in this order to cover the insulating layer 2 to achieve strong adhesion. While the thickness of conductive layer 3 is not particularly limited, it is preferably about 600–6000 Å, more preferably about 1300–3700 Å, from the aspect of improvement of adhesion. When the conductive layer 3 consists of a laminate of the above-mentioned Cr layer (film) and Cu layer (film), the thickness of the Cr layer (film) is preferably 100–1000 Å (more preferably 300–700 Å), the thickness of the Cu layer (film) is preferably 500–5000 Å (more preferably 1000–3000 Å).

The method for forming the conductive layer 3 is not particularly limited and nonelectrolytic plating method, sputtering vapor-deposited method and the like are exemplified.

Figure 3:
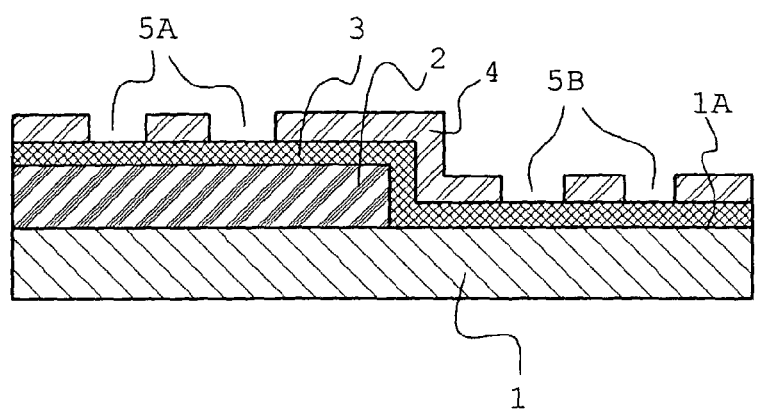
FIG. 3 shows a schematic sectional view of the state where a circuit pattern and a resist pattern for forming a dummy pattern have been formed after the state shown in FIG. 2.

As shown in FIG. 3, a resist pattern 4 for forming a circuit pattern and for forming a dummy pattern on the above-mentioned conductive layer 3 is formed. The resist used for forming a resist pattern 4 is exemplified by a dry film resist and a liquid resist, with preference given to a dry film resist from the aspect of production cost and the like. Of the dry film resists, an acrylic dry film resist is preferable for acid resistance. In the case of a liquid resist, a resist film is formed by a method such as screen printing, spin coater and the like. In the case of a dry film resist, it is fixed on the conductive layer 3 by pressing with a suitable roller.

The thickness of the resist pattern 4 is preferably about 1–50 μm, more preferably about 20–40 μm, in consideration of easy deposition of the plating metal during electroplating to form a circuit pattern and a dummy pattern to be mentioned later and the thickness of the final circuit pattern.

A method of forming a resist pattern 4 (method of forming an opening in a resist film) is exemplified by laser processing, photolithography processing and the like. In view of the dimensional precision and processing cost, photolithography processing (forming an opening by exposure via a photomask and development) is preferable. The width of the opening 5A for forming a circuit pattern (=width of pattern of circuit pattern 6 to be mentioned below) is generally in the range of 1–2000 μm, preferably 5–200 μm. In contrast, the width of an opening 5B for forming a dummy pattern (=width of pattern of dummy pattern 7 to be mentioned below) is preferably not more than 200 μm, more preferably 10–60 μm. By employing such preferable width, the dummy pattern can be certainly dissolved for removal in the step for dissolving (wet etching) the supporting substrate to be mentioned below. In FIG. 3, two openings 5B for forming a dummy pattern are formed, but the number and shape of the opening are not particularly limited and can be changed as appropriate depending on the shape, number, layout and the like of the circuit pattern.

Figure 7A:
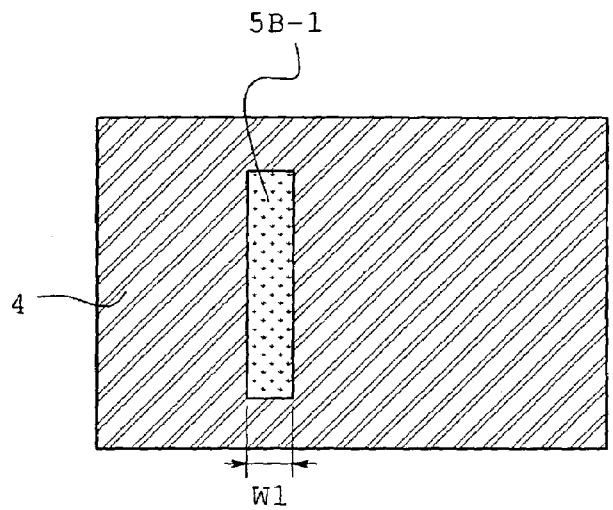
FIG. 7(a)–FIG. 7(c) show variation in the pattern of the opening for forming a dummy pattern.
Figure 7B:
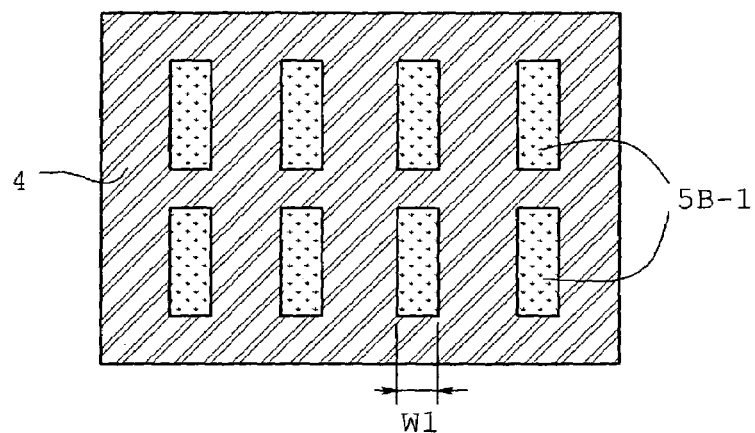
Figure 7C:
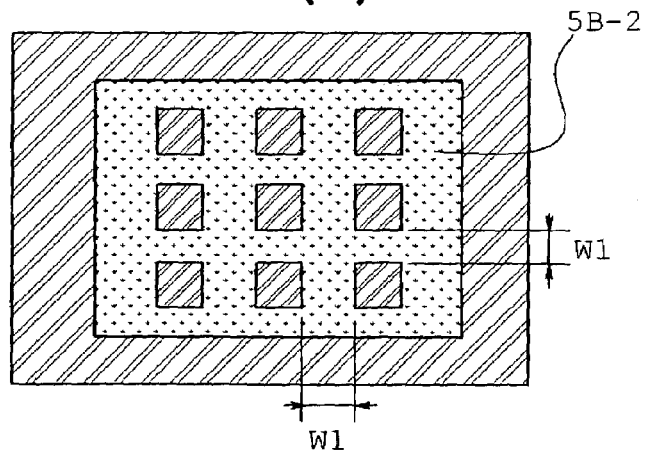

FIG. 7(a)–FIG. 7(c) show concrete examples of variation in the pattern of the opening for forming a dummy pattern. In FIG. 7(a), one linear opening 5B-1 has been formed, in FIG. 7(b), plural linear openings 5B-1 have been formed, and in FIG. 7(c), lattice opening for forming a dummy pattern 5B-2 has been formed.

The shape of the opening for forming a dummy pattern is linear such as a straight line (e.g., FIG. 7(a), FIG. 7(b)), curve, zigzag and the like, lattice (the aforementioned FIG. 7(c)), circle, ellipse, polygonal, a combination of these shapes and the like. In the case of lattice as shown in FIG. 7(c), the shape of the resist where linear openings cross is not particularly limited and may be any shape such as tetragon, circle, ellipse and the like.

In the present invention, the width of the opening for forming a dummy pattern (=pattern width of dummy pattern) corresponds to the line width (in case of lattice, the width of line forming the lattice) when the shape of the opening is linear or lattice. In the case of the aforementioned FIG. 7(a) –FIG. 7(c), W1 therein shows the width of the opening (=pattern width of dummy pattern). When the shape of the opening is circle, it shows a diameter, when the shape of the opening is ellipse, it shows a minor axis thereof, and when the shape of the opening is polygonal, it shows a width of the minimum width part. As used herein, the "minimum width part of polygon" corresponds to, when the polygon has an odd number of vertexes (triangle, pentagon etc.), the length of (a path of) the minimum perpendicular of all the perpendiculars drawn from respective vertexes to their facing sides. In the case of a polygon having an even number of vertexes (quadrangle, hexagon etc.), the minimum width part of the polygon corresponds to the length of (a path of) the minimum perpendicular of all the perpendiculars with respect to the sides, from the middle point of which they are drawn, to the point of intersection with their facing sides.

As mentioned above, the width of the opening for forming a dummy pattern (=pattern width of dummy pattern) is preferably set for not more than 200 μm in the present invention, whereby the dummy pattern can be certainly dissolved and removed by etching along with the supporting substrate. The etching of the dummy pattern is conducted along with the penetration of an etching solution between the resist and the dummy pattern. When the dummy pattern forms an ellipse or polygon, the minor axis of not more than 200 μm, or the minimum width part of polygon of not more than 200 μm permits sufficient penetration of the etching solution between the dummy pattern and the resist even in a short etching time, thus resulting in the removal of the dummy pattern.

Figure 4:
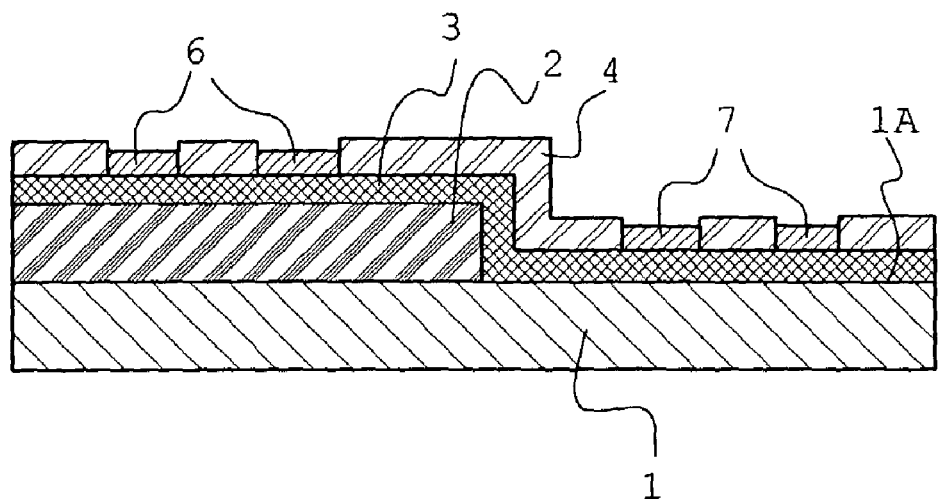
FIG. 4 shows a schematic sectional view of the state where a metal for wiring is deposited on the opening in the resist, thereby to form a circuit pattern and a dummy pattern, after the state shown in FIG. 3.

After forming the opening for forming a circuit pattern and an opening for forming a dummy pattern in the above-mentioned manner, a circuit pattern and a dummy pattern are formed as shown in the following. That is, a metal (alloy) for wiring is deposited by electroplating in an opening 5A for forming a circuit pattern and an opening for forming a dummy pattern 5B, in the above-mentioned resist 4, thereby to form a circuit pattern 6 and a dummy pattern 7 (FIG. 4). Examples of the metal (alloy) for wiring include metals such as Cu, Au, stainless steel, Al, Ni and the like, and alloy obtained by adding Be, Ni, Co, Ag, Pb, Cr and the like to these metals are preferable. of these, Cu is more preferable from the mechanical properties such as strength, elastic modulus and the like, and the electrical properties such as electric conductivity and the like. The thickness of the circuit pattern 6 is preferably 2–30 μm, more preferably 5–20 μm.

Figure 5:
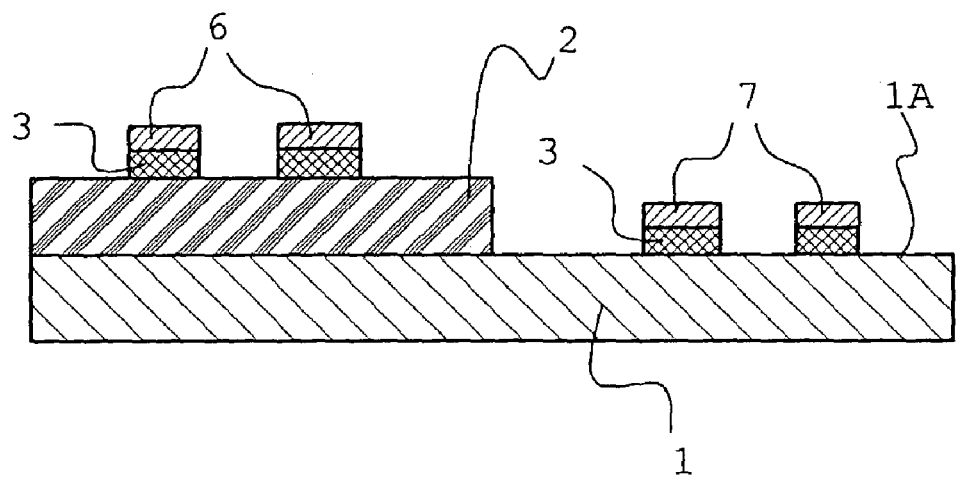
FIG. 5 shows a schematic sectional view of the state where the resist pattern 4 is removed and the unnecessary part of the conductive layer is removed after the state shown in FIG. 4.

Then, after removing the resist pattern 4 by wet etching using, for example, an alkaline solution and the like, the unnecessary part of the conductive layer 3 is removed (FIG. 5). While the method for removing the unnecessary part of the conductive layer 3 is not particularly limited, for example, a method comprising masking the entirety of the exposed part of the supporting substrate 1, the entirety of the circuit pattern 6 and a part of the dummy pattern 7, and applying wet etching and the like are exemplified. In this method, for example, a mask made of an acrylic dry film resist is preferably used and an aqueous solution of potassium ferricyanide type, potassium permanganate type, sodium metasilicate type and the like are preferably used as an etching solution. The above constitutes Step 2.

[Step 3]

After forming the circuit pattern 6 and the dummy pattern 7 in the above-mentioned manner, the dummy pattern 7 is removed together. with the unnecessary part of the supporting substrate 1 by the following steps.

Figure 6A:
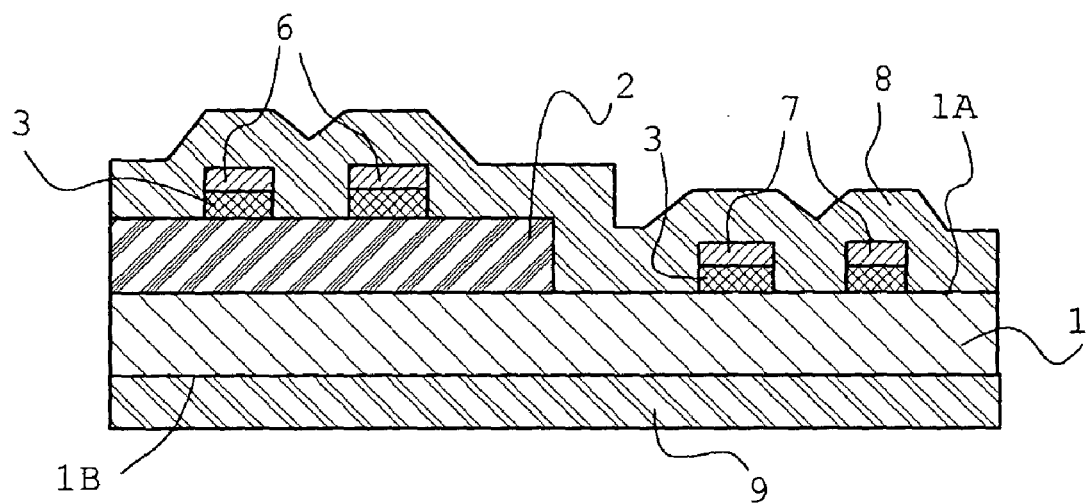
FIG. 6(a)–FIG. 6(d) show a schematic sectional view of a series of steps for removing the dummy pattern along with the unnecessary part of the supporting substrate by wet etching after the state shown in FIG. 5.

As shown in FIG. 6(a), on one surface (top surface) 1A of the supporting substrate 1, all the conductive layer 2, circuit pattern 6 and dummy pattern 7 are covered with a resist (film) 8 and the entire surface of the other surface (bottom surface) 1B of the supporting substrate 1 is covered with a resist (film) 9. As the resists (films) 8 and 9, for example, a dry film resist, a liquid resist and the like are preferably used, and the dry film resist is more preferable. Of the dry film resists, an acrylic dry film resist is particularly preferable in view of acid resistance.

Figure 6B:
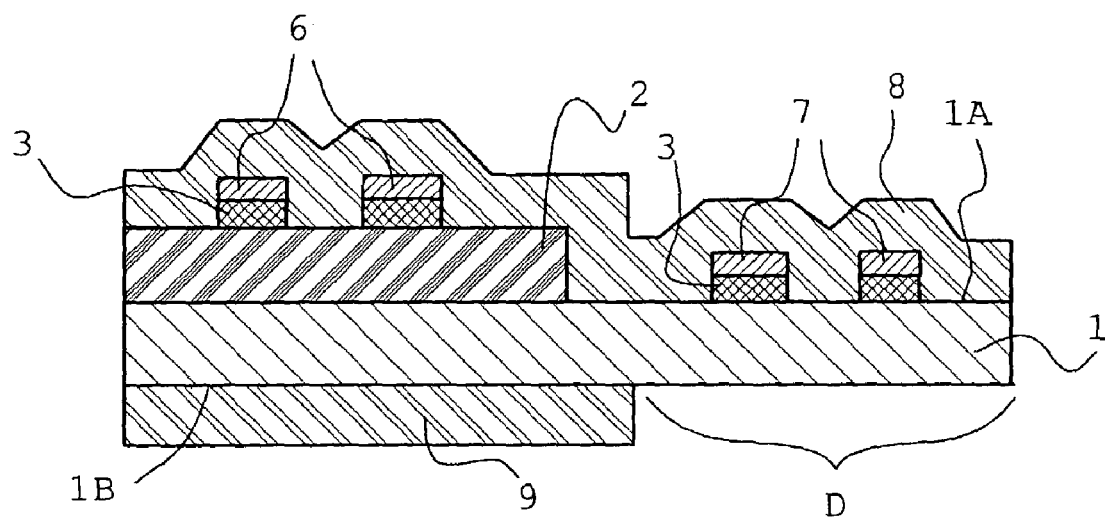

Then, as shown in FIG. 6(b), the resist (film) 9 covering the entire surface of the other surface (bottom surface) 1B of the supporting substrate 1 is subjected to photolithography processing to expose the unnecessary part D (part having a dummy pattern 7) free of the insulating layer 2 and the circuit pattern 6 on the supporting substrate 1.

Figure 6C:
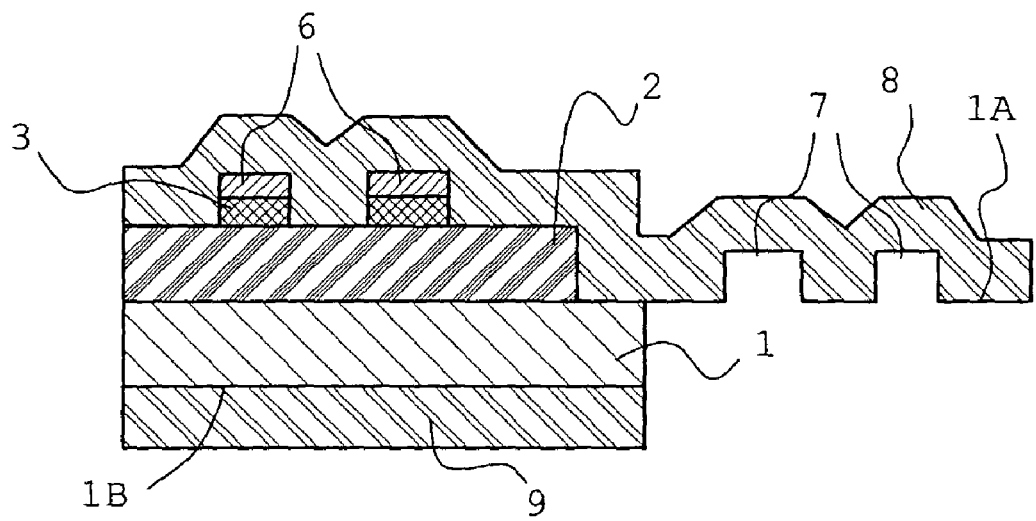

Then, as shown in FIG. 6(c), the other surface (bottom surface) 1B of the supporting substrate 1 is subjected to wet etching to remove the unnecessary part D of the supporting substrate simultaneously with the dummy pattern 7. While the etching solution for the wet etching varies depending on the materials of the supporting substrate 1 and the dummy pattern 7 (circuit pattern 6), an aqueous solution and the like of ferric chloride, cupric chloride and the like are preferable.

Figure 6D:
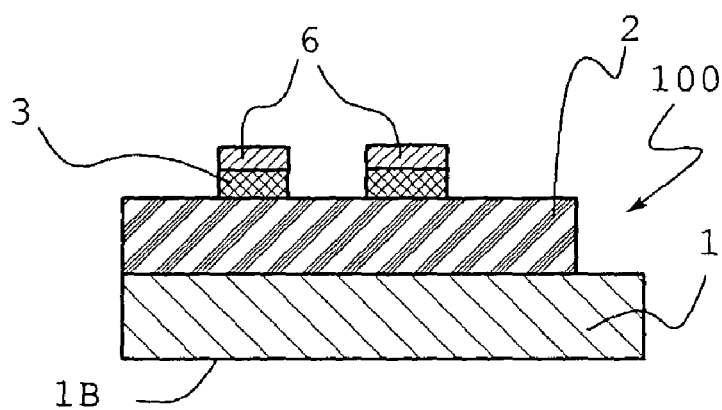

Thereafter, the resists (films) 8 and 9 are completely removed to complete the printed circuit board 100 shown in FIG. 6(d).

The production example of the printed circuit board 100 explained by referring to FIGS. 1–6 in the above is a production example by a semi-additive method. When a circuit board is produced by the additive method, the same steps except the above-mentioned conductive layer 3 are basically applied.

The printed circuit board to be produced by the production method of the present invention has a structure wherein (a pattern of) an insulating layer 2 is formed on a supporting substrate 1 (metal foil, metal thin plate etc.) and a circuit pattern 6 is formed on the insulating layer 2. As compared to a conventional one comprising a circuit pattern formed on an insulating substrate, it advantageously shows fine elasticity and permits bending processing.

EXAMPLES

The present invention is explained in detail by referring to examples, which are not to be construed as limitative.

Example 1

A polyamide resin precursor solution having photosensitivity was applied on a 20 μm-thick stainless steel foil (SUS304 H-TA) such that the thickness after drying became 24 μm and dried at 130° C. to give a coating of a polyimide resin precursor.

This coating was exposed to light via a photomask (wavelength: 405 nm, exposure accumulated energy: 700 mJ/cm$^2$). After heating the exposed part to 180° C., the coating was developed with an alkaline developer for patterning of a negative-type image. The patterned polyimide resin precursor coating was heated at 350° C. for setting (imidization), whereby a 10 μm-thick base layer (insulating layer) made from a polyimide resin and having a given pattern was prepared.

Then, a 300 Å-thick Cr thin film and a 700 Å-thick Cu thin film were formed in this order on the entirety of the stainless steel foil and the base layer (insulating layer) by the sputtering vapor-deposition method.

Thereafter, a 30 μm-thick acrylic type dry film resist was adhered to the above-mentioned Cu thin film.

The above-mentioned dry film resist was then subjected to photolithographic processing to form an opening for forming a circuit pattern and an opening for forming a dummy pattern. The opening pattern for forming a circuit pattern had a width of 15–1500 μm, 4 per set, 84 sets arranged at pitch 3 mm and the opening for forming a dummy pattern was straight and had a width of 50 μm, plural openings arranged at pitch 120 μm. The opening for forming a dummy pattern was formed at 100 μm–5 mm away from the circuit pattern.

Figure 8:
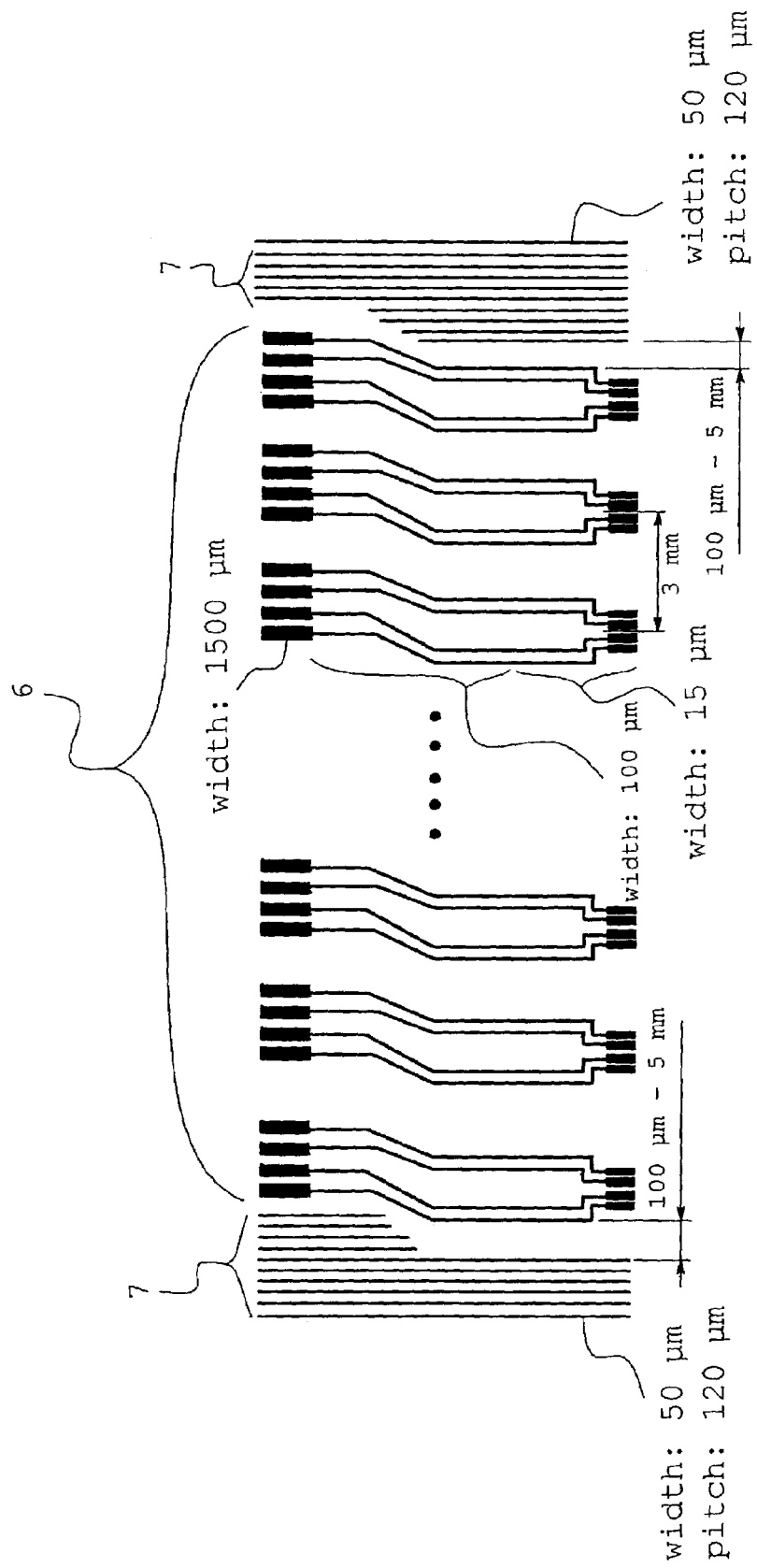
FIG. 8 is a layout of the circuit pattern and the dummy pattern in Examples.
Figure 9A:
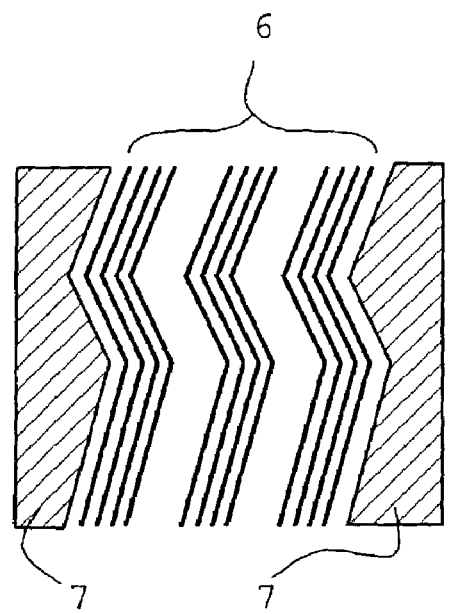
FIG. 9(a)–FIG. 9(c) schematically show positional relationship between a circuit pattern and a dummy pattern in a conventional printed circuit board.
Figure 9B:
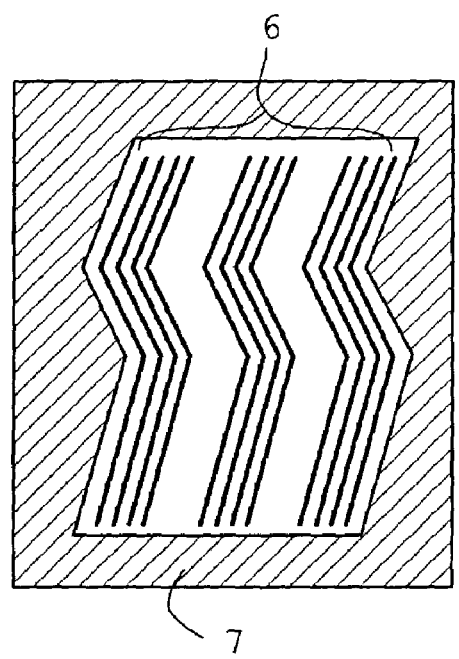
Figure 9C:
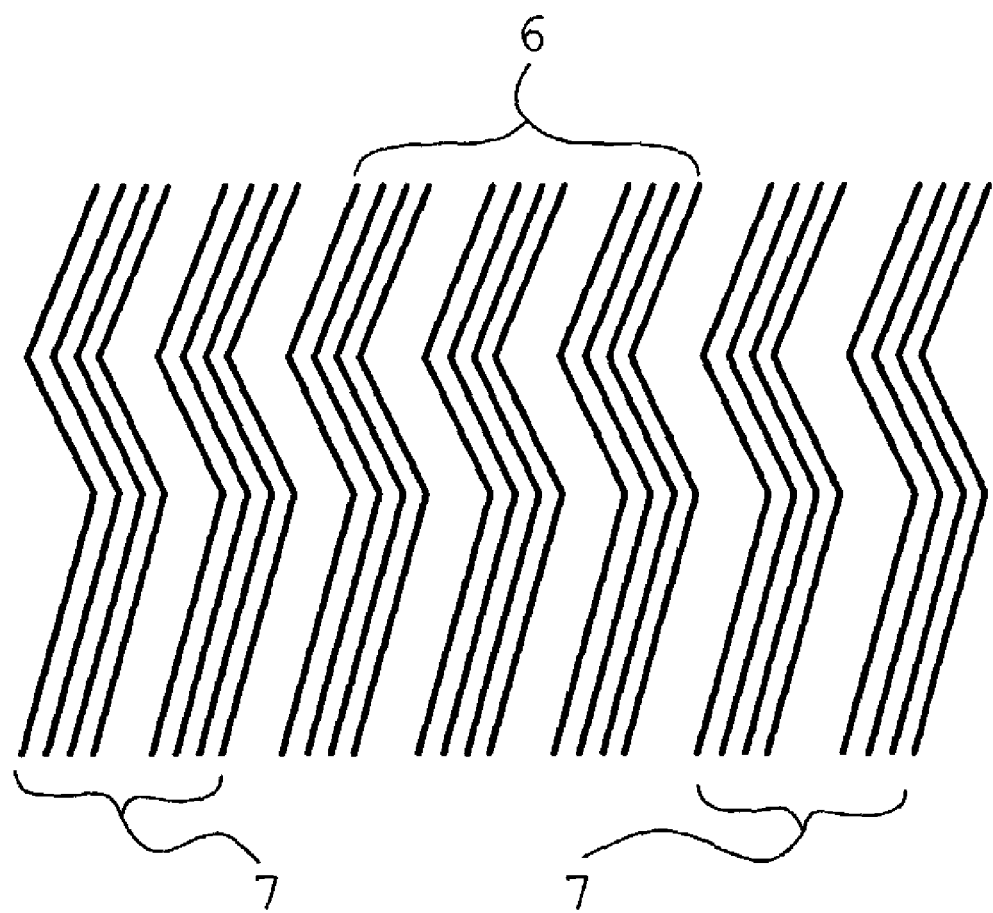

Cu was deposited inside the above-mentioned opening pattern by electroplating to form a 14 μm-thick circuit pattern and a dummy pattern. FIG. 8 is a layout of the circuit pattern 6 and the dummy pattern 7.

After complete removal of the above-mentioned dry resist film by chemical etching (etchant: aqueous alkaline solution), the entire conductive pattern and a part of the dummy pattern were masked with an acrylic type dry film resist, and the Cr thin film and Cu thin film were removed by wet etching (etching solution: aqueous potassium permanganate solution).

The entire exposed surface of the stainless steel foil, circuit pattern, base layer and dummy pattern was covered with an acrylic type dry film resist from the top surface side and from the underside of the stainless steel foil, after which the unnecessary part (the part free of base layer and circuit pattern) of the stainless steel foil was exposed by photolithographic processing.

Then, using an aqueous ferric chloride solution as an etching solution, wet etching was applied from the underside of the stainless steel foil to remove the unnecessary part of the stainless steel foil and the dummy pattern. The remaining resist film was removed to complete a printed circuit board.

Comparative Example 1

In the same manner as in Example 1 except that a step for forming a dummy pattern was not included, a printed circuit board was obtained.

(Evaluation)

The thickness of the circuit pattern of the above-mentioned printed circuit board and the variation thereof were measured as in the following.

The zero point of a linear gauge (ZC-101, NIKON CORPORATION) was set for the base layer (insulating layer) and the height of the circuit pattern measured from the base layer as the base point was taken as the thickness of the circuit pattern. The circuit pattern to be measured had a width of 100 μm, and the average of 162 measures and the standard deviation were calculated. The results are as follows.

Example 1: average thickness 14.0 μm, standard deviation 0.37 μm

Comparative Example 1: average thickness 14.0 μm, standard deviation 0.74 μm

As is clear from the foregoing explanation, the production method of the printed circuit board of the present invention does not require any special step for removal of a dummy pattern, thereby reducing the number of steps from the conventional methods. As a result, a printed circuit board having a circuit pattern with a little variation in the thickness can be produced at a low cost. Because a dummy pattern can be formed irrespective of the shape of the circuit pattern, designing of the shape of the dummy pattern is advantageously facilitated.

This application is based on patent application No. 2002-67245 filed in Japan, the contents of which are hereby incorporated by reference.

What is claimed is:

1. A production method of a printed circuit board, which comprises the steps of forming an insulating layer in a given pattern on one surface of a supporting substrate, forming a circuit pattern on the insulating layer while forming a dummy pattern in an area free of the insulating layer on said surface of the supporting substrate, and simultaneously removing by dissolving an unnecessary part of the supporting substrate, which is free of the insulating layer and the circuit pattern, and the dummy pattern.

2. The production method of the printed circuit board of claim 1, wherein said dummy pattern has a width of the pattern of not more than 200 μm.

3. The production method of the printed circuit board of claim 1, wherein said supporting substrate is made of stainless steel, Ni—Fe alloy, copper, aluminum, copper-beryllium or phosphor bronze.

4. The production method of the printed circuit board of claim 1, wherein said insulating layer is made from a polyimide resin containing a photosensitive material.

* * * * *